(12) United States Patent
Reams

(10) Patent No.: US 9,691,408 B2
(45) Date of Patent: Jun. 27, 2017

(54) SYSTEM AND METHOD FOR DYNAMIC EQUALIZATION OF AUDIO DATA

(71) Applicant: Psyx Research, Inc., Irvine, CA (US)

(72) Inventor: Robert W. Reams, Mill Creek, WA (US)

(73) Assignee: PSYX RESEARCH, INC., Irvine, CA (US)

( * ) Notice: Subject to any disclaimer, the term of this patent is extended or adjusted under 35 U.S.C. 154(b) by 0 days.

(21) Appl. No.: 14/863,357

(22) Filed: Sep. 23, 2015

(65) Prior Publication Data

US 2016/0171985 A1    Jun. 16, 2016

Related U.S. Application Data

(60) Provisional application No. 62/092,603, filed on Dec. 16, 2014, provisional application No. 62/133,167, (Continued)

(51) Int. Cl.
| | |
|---|---|
| *H03G 5/00* | (2006.01) |
| *G10L 21/034* | (2013.01) |
| *H04S 3/02* | (2006.01) |
| *G10L 19/02* | (2013.01) |
| *G10L 21/02* | (2013.01) |

(Continued)

(52) U.S. Cl.
CPC .............. *G10L 21/034* (2013.01); *G10L 19/02* (2013.01); *G10L 19/028* (2013.01); *G10L 21/02* (2013.01); *G10L 21/0205* (2013.01); *G10L 25/06* (2013.01); *H04N 5/52* (2013.01); *H04N 5/60* (2013.01); *H04N 21/439* (2013.01); *H04R 3/00* (2013.01); *H04R 25/356* (2013.01); *H04R 25/505* (2013.01); *H04S 3/02* (2013.01);

(Continued)

(58) Field of Classification Search
CPC ........... H03G 5/165; H03G 5/025; H04R 3/14
USPC ..................... 381/98–99, 103, 104, 107–109
See application file for complete search history.

(56) References Cited

U.S. PATENT DOCUMENTS

| | | | | |
|---|---|---|---|---|
| 4,052,571 A * | 10/1977 | Gregory | ............... | H04R 25/356 333/14 |
| 2003/0233234 A1 | 12/2003 | Truman et al. | | |
| 2006/0217975 A1 | 9/2006 | Sung et al. | | |
| 2013/0010972 A1* | 1/2013 | Ma | ...................... | H04R 25/356 381/23.1 |

FOREIGN PATENT DOCUMENTS

WO    2010/003556 A1    1/2010

OTHER PUBLICATIONS

The Invitation to pay additional fees and, where applicable, protest fee issued by EPO on Mar. 23, 2016 for International patent application No. PCT/US2015/065936.

(Continued)

*Primary Examiner* — Disler Paul
(74) *Attorney, Agent, or Firm* — Jackson Walker LLP; Christopher J. Rourk

(57) ABSTRACT

A system for processing audio data is disclosed that includes a plurality of gain adjustment devices, each gain adjustment device having an associated audio input frequency band. A plurality of control signal processing systems are configured to receive audio input data for one of the associated audio input frequency bands and to generate a gain adjustment device control signal. The gain adjustment device control signal is configured to decrease a gain setting of an associated gain adjustment device for a predetermined period of time as a function of a transient in the associated audio input frequency band.

17 Claims, 4 Drawing Sheets

Related U.S. Application Data filed on Mar. 13, 2015, provisional application No. 62/156,061, filed on May 1, 2015, provisional application No. 62/156,065, filed on May 1, 2015.

(51) Int. Cl.

| | | |
|---|---|---|
| *H04N 5/52* | (2006.01) | |
| *H04N 5/60* | (2006.01) | |
| *H04N 21/439* | (2011.01) | |
| *G10L 25/06* | (2013.01) | |
| *H04R 3/00* | (2006.01) | |
| *H04R 25/00* | (2006.01) | |
| *G10L 19/028* | (2013.01) | |
| *H04R 3/14* | (2006.01) | |
| *H03G 5/16* | (2006.01) | |

(52) U.S. Cl.
CPC ............... *H03G 5/165* (2013.01); *H04R 3/14* (2013.01); *H04R 2225/43* (2013.01); *H04R 2420/01* (2013.01)

(56) References Cited

OTHER PUBLICATIONS

Anonymous, "Dynamic range compression, Wikipedia, the free encyclopedia", 2003.

Anonymous, "Noise gates—Dynamics processors—Pro-Audio Basics", 2014.

The International Search report and Written Opinion issued by EPO on May 31, 2016 for International patent application No. PCT/US2015/065936.

Ritchie, "MediaRenderer:1 Device Template Version 1.01", UPnP™ Forum, Jun. 25, 2002, pp. 1-12.

Ritchie, "MediaServer:1 Device Template Version 1.01", UPnP™ Forum, Jun. 25, 2002, pp. 1-12.

Kou et al., "RenderingControl:1 Service Template Version 1.01", UPnP™ Forum, Jun. 25, 2002, pp. 1-63.

Lawrence, "Basic:1.0 Device Definition Version 1.0", UPnP™ Forum, Dec. 12, 2002, pp. 1-7.

Stickler et al., "HVAC_System:1 Device Template", UPnP™ Forum, May 13, 2003, pp. 1-8.

"Universal Plug and Play Device Architecture", Jun. 8, 2000, ver. 1.0, pp. 1-54.

Miller et al., "UPnP Forum AV:4 Overview", UPnP™ Forum, 2012, pp. 1-45.

Ritchie et al., "UPnP AV Architecture:1", UPnP™ Forum, Jun. 25, 2002, pp. 1-22.

Buerl et al., "AVTransport:1 Service Template Version 1.01", UPnP™ Forum, Jun. 25, 2002, pp. 1-67.

Chan et al., "ConnectionManager:1 Service Template Version 1.01", UPnP™ Forum, Jun. 25, 2002, pp. 1-25.

Debique et al., "ContentDirectory:1 Service Template Version 1.01", UPnP™ Forum, Jun. 25, 2002, pp. 1-89.

* cited by examiner

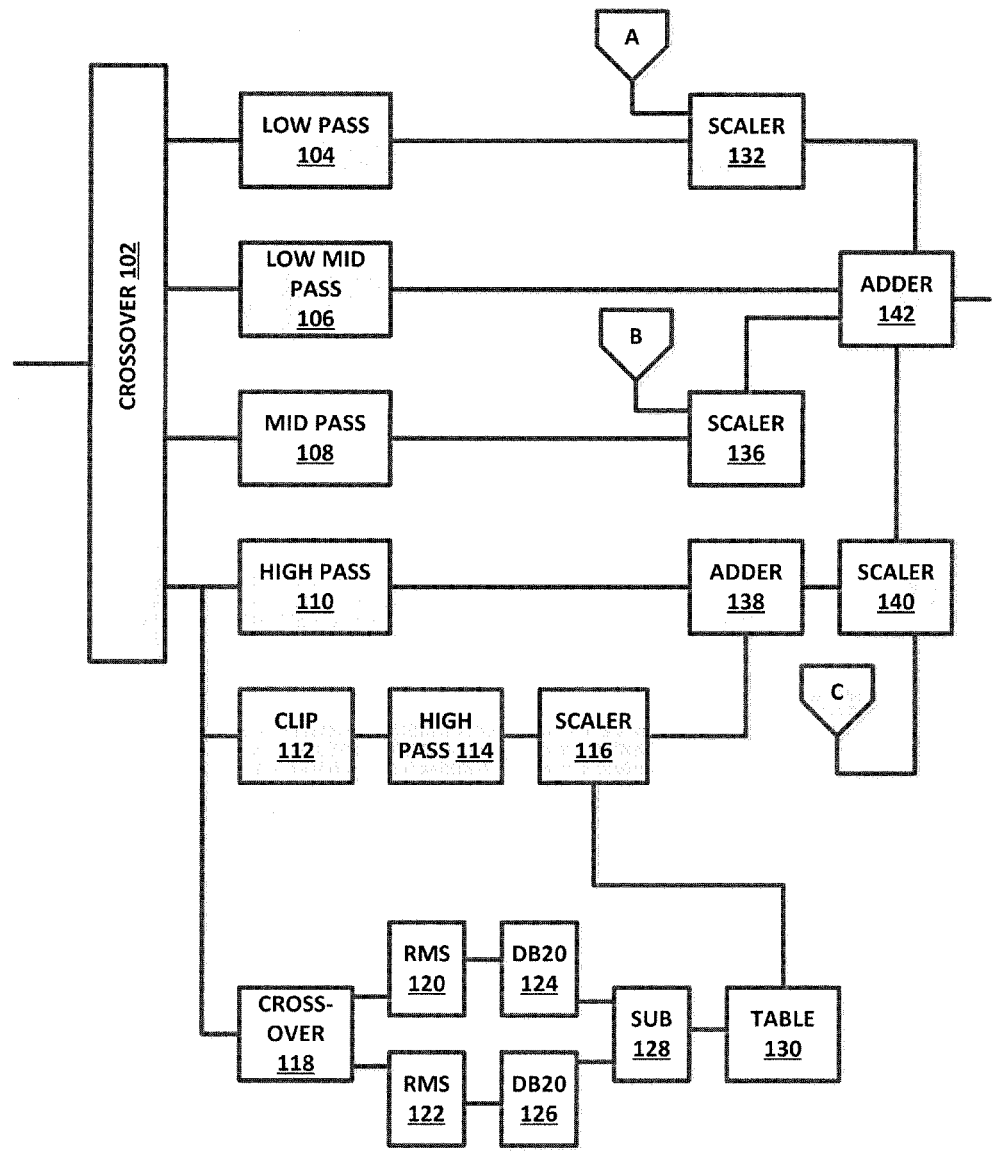

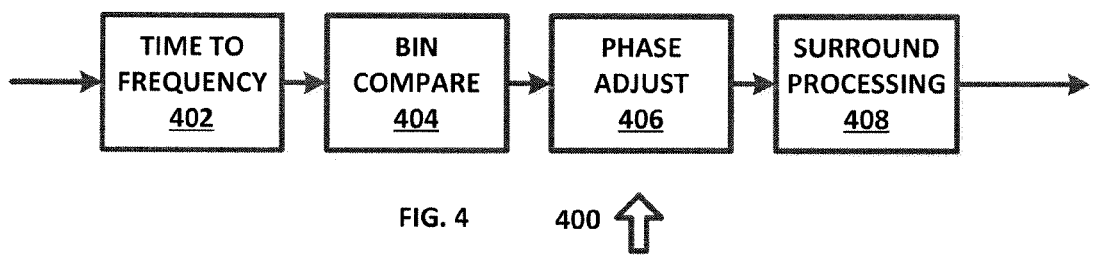
FIG. 4    400
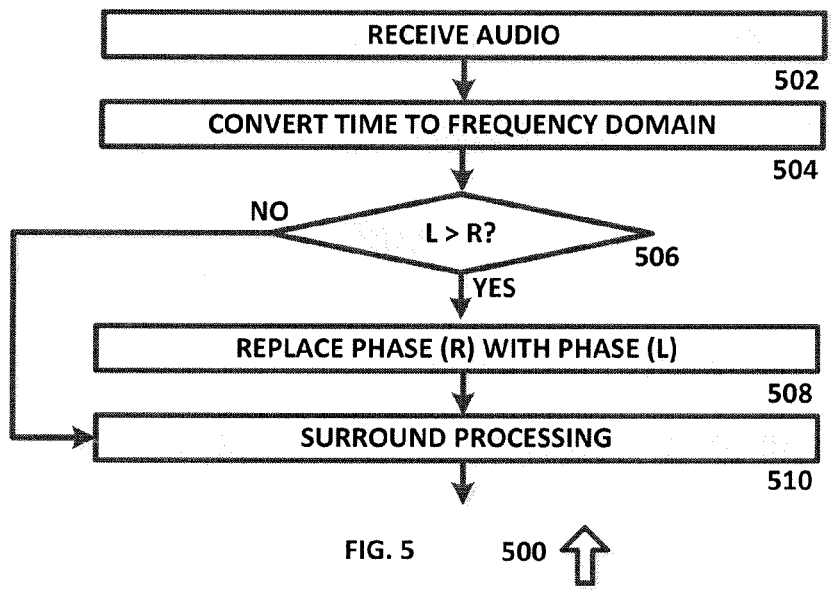
FIG. 5    500

SYSTEM AND METHOD FOR DYNAMIC EQUALIZATION OF AUDIO DATA

RELATED APPLICATIONS

The present application claims priority to and benefit of U.S. Provisional Patent Application No. 62/092,603, filed on Dec. 16, 2014, U.S. Provisional Patent Application No. 62/133,167, filed on Mar. 13, 2015, U.S. Provisional Patent Application No. 62/156,061, filed on May 1, 2015, and U.S. Provisional Patent Application No. 62/156,065, filed on May 1, 2015, each of which are hereby incorporated by reference for all purposes as if set forth herein in their entirety.

TECHNICAL FIELD

The present disclosure relates generally to audio data processing, and more specifically to a system and method for dynamic equalization of audio data that reduces audio energy processing consumption.

BACKGROUND OF THE INVENTION

Equalization of audio data is used to control the relative gain of frequency components of the audio data, such as to boost low frequency components, middle frequency components or high frequency components.

SUMMARY OF THE INVENTION

A system for processing audio data is disclosed that includes a plurality of gain adjustment devices, each gain adjustment device having an associated audio input frequency band. A plurality of control signal processing systems are configured to receive audio input data for one of the associated audio input frequency bands and to generate a gain adjustment device control signal. The gain adjustment device control signal is configured to decrease a gain setting of an associated gain adjustment device for a predetermined period of time as a function of a transient in the associated audio input frequency band.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE SEVERAL VIEWS OF THE DRAWINGS

Aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views, and in which:

FIG. 4 is a diagram of a system for parametric stereo processing, in accordance with an exemplary embodiment of the present disclosure; and FIG. 5 is a diagram of an algorithm for parametric stereo processing, in accordance with an exemplary embodiment of the present disclosure.

DETAILED DESCRIPTION OF THE INVENTION

Figure 1:
FIG. 1 is a diagram of a system for dynamic equalization of audio data, in accordance with an exemplary embodiment of the present disclosure.

In the description that follows, like parts are marked throughout the specification and drawings with the same reference numerals. The drawing figures might not be to scale and certain components can be shown in generalized or schematic form and identified by commercial designations in the interest of clarity and conciseness.

Audio data can include events that are louder than other events, such as gunshots, cymbal crashes, drum beats and so forth. When these events occur, they mask audio data that is 13 dB lower in gain for a period of time (typically around 200 milliseconds), such as audio data that has the same frequency components as the frequency components of the event. This masking occurs as a result of the psychoacoustic processes related to hearing. However, even though the masked audio signals cannot be perceived, the nerve cells in the organ of Corti are still receiving the masked audio signals, and are using energy to process them. This additional energy use results in a loss of hearing sensitivity. As such, the audio processing system that amplifies such signals is not only wasting energy on amplification of signals that are not perceived by the listener, it is also wasting that energy to create an inferior listening experience.

By detecting such transient events and dynamically equalizing the audio data to reduce the audio signals that will be masked, the amount of energy consumed by the audio processing system can be reduced, which can result in longer battery life. In addition, the effect of such masked audio signals on the nerves in the organ of Corti can be reduced or eliminated, which results in an improved audio experience for the listener.

FIG. 1 is a diagram of a system 100 for dynamic equalization of audio data, in accordance with an exemplary embodiment of the present disclosure. System 100 can be implemented in hardware or a suitable combination of hardware and software.

As used herein, "hardware" can include a combination of discrete components, an integrated circuit, an application-specific integrated circuit, a field programmable gate array, or other suitable hardware. As used herein, "software" can include one or more objects, agents, threads, lines of code, subroutines, separate software applications, two or more lines of code or other suitable software structures operating in two or more software applications, on one or more processors (where a processor includes a microcomputer or other suitable controller, memory devices, input-output devices, displays, data input devices such as a keyboard or a mouse, peripherals such as printers and speakers, associated drivers, control cards, power sources, network devices, docking station devices, or other suitable devices operating under control of software systems in conjunction with the processor or other devices), or other suitable software structures. In one exemplary embodiment, software can include one or more lines of code or other suitable software structures operating in a general purpose software application, such as an operating system, and one or more lines of code or other suitable software structures operating in a specific purpose software application. As used herein, the term "couple" and its cognate terms, such as "couples" and "coupled," can include a physical connection (such as a copper conductor), a virtual connection (such as through randomly assigned memory locations of a data memory device), a logical connection (such as through logical gates of a semiconducting device), other suitable connections, or a suitable combination of such connections.

System 100 includes crossover 102, which receives audio data and processes the audio data to generate separate frequency bands of audio data. In one exemplary embodiment, crossover 102 can generate a first band having a frequency range of 0-50 Hz, a second band having a frequency range of 50-500 Hz, a third band having a frequency range of 500-4500 Hz and a fourth band having a frequency range of 4500 Hz and above, or other suitable numbers of bands and associated frequency ranges can also or alternatively be used. The input to crossover 102 can be an unprocessed audio signal, a normalized audio signal or other suitable audio signals.

The outputs of crossover 102 are further filtered using associated filters, such as low pass filter 104, low mid pass filter 106, mid pass filter 108 and high pass filter 110, or other suitable filters. In addition, the high frequency band can be further processed to add harmonic components, such as to compensate for lossy compression processing of the audio data that can result in audio data having a narrow image width and sparse frequency components. In one exemplary embodiment, the harmonic components can be added using clipping circuit 112, which generates harmonic components by clipping the high frequency components of the audio data. High pass filter 114 is used to remove lower frequency harmonic components, and scaler 116 is used to control the magnitude of the harmonic processed audio that is added to the unprocessed audio at adder 138. Control of scaler 116 is provided by crossover 118, which can generate a high frequency band output for frequencies above a predetermined level, such as 8000 Hz, and a low frequency band output for frequencies below the predetermined level. The RMS values of the high and low frequency bands are generated by RMS processors 120 and 122, and the RMS values are then converted from linear values to log values by DB20 124 and DB20 126, respectively. The difference between the high and low frequency components is then determined using subtractor 128, and a value from table 130 is used to determine the amount of high frequency harmonic frequency component signal to be added to the unprocessed high frequency audio signal. In one exemplary embodiment, the amount can be set to zero until there is a 6 dB difference between the low and high frequency components, and as the difference increases from 6 dB to 10 dB, the amount of high frequency harmonic frequency component signal that is added to the unprocessed high frequency audio signal can increase from 0 dB to 8 dB. As the difference between the low and high frequency components increases from 10 dB to 15 dB, the amount of high frequency harmonic frequency component signal that is added to the unprocessed high frequency audio signal can increase from 8 dB to 9 dB. Likewise, other suitable amounts of high frequency harmonic frequency component signal can be added to the unprocessed high frequency audio signal. Increasing the amount of high frequency harmonic frequency component signal that is added to the unprocessed high frequency audio signal as a function of the change in the relative content of low and high frequency components of the high frequency band can be used to improve audio quality, because the difference is indicative of a sparse audio signal. The additional harmonic content helps to improve a sparse audio signal by providing additional frequency components that are complementary to the audio data. The high frequency harmonic components are then added to the unprocessed high frequency components by adder 138.

Equalization of the low pass frequency component is accomplished using scaler 132 under control of an input A, equalization of the mid pass frequency component is accomplished using scaler 136 under control of an input B, and equalization of the high pass frequency component is accomplished using scaler 140 under control of an input C. The outputs of the equalized audio components and the unprocessed low-mid pass output 106 are combined using adder 142 to generate an output.

In operation, system 100 performs dynamic equalization to reduce power loss and also improves audio signal quality. The psychoacoustic masking processes result in a 150 to 200 millisecond loss in perception when a masking input having a crest of 13 dB or more is generated, due to the reaction of kinocilia to such audio inputs. When such transients occur, then maintain or increasing audio during the dead zone that follows the transient only serves to increase the power consumed by the audio processing system without increasing audio quality. In addition, while the audio input is not resulting in nerve signals that ultimately reach the listener's brain, processing of that audio energy still requires work to be done by kinocilia in the organ of Corti, and can also increase the amount of additional energy that is required in order to generate a perceptible response. By dynamically equalizing the audio data to reduce the gain during such periods, system 100 helps to reduce both the amount of energy required to process the audio data as well as the amount of energy required by the listener to listen to the audio data. In addition, adding harmonic frequency content to the high frequency audio data when the total audio data content is sparse helps to improve the perceived audio quality, by providing additional frequency components in the sparse audio data that complement the existing frequency components.

Figure 2:
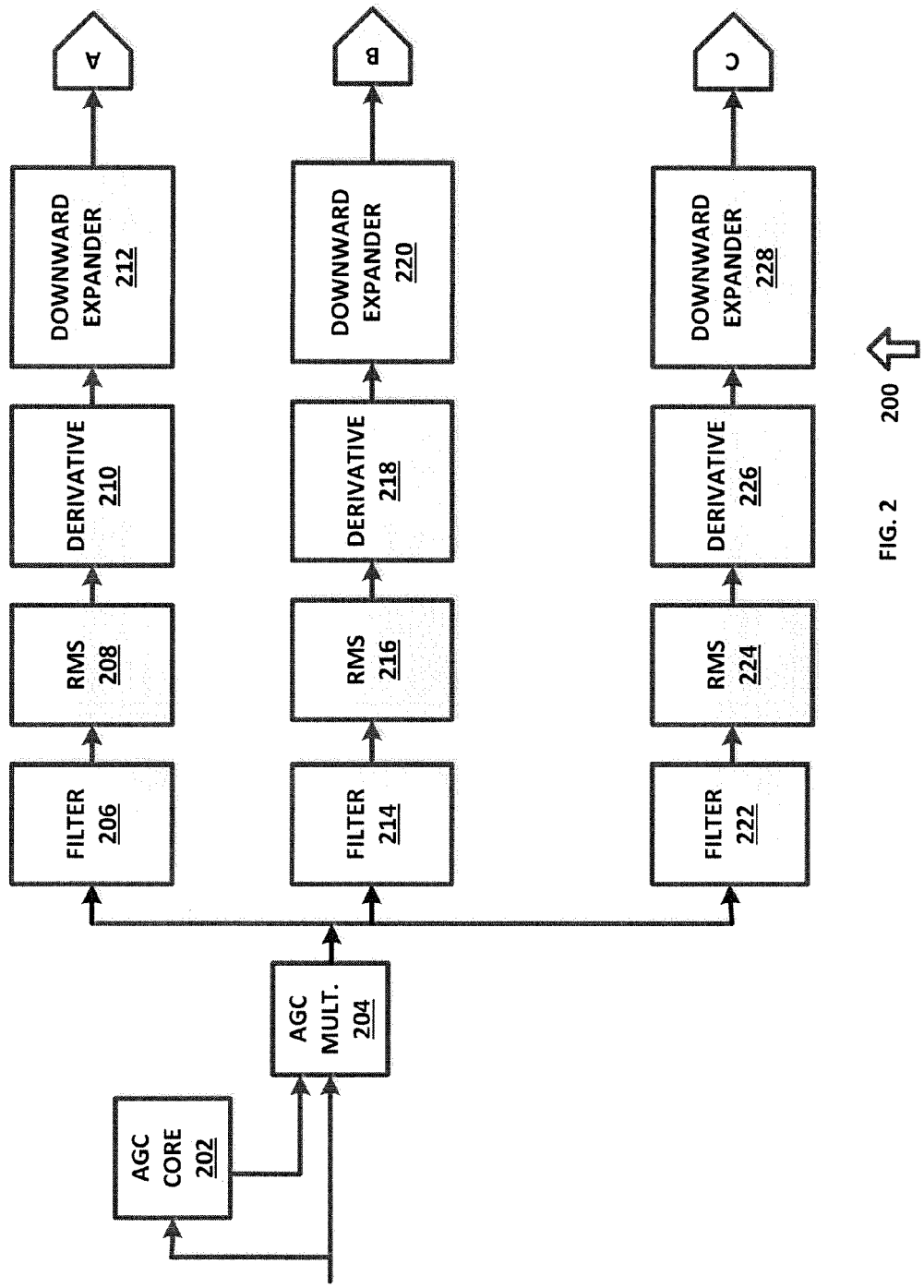
FIG. 2 is a diagram of a system for controlling dynamic equalization of audio data, in accordance with an exemplary embodiment of the present disclosure.

FIG. 2 is a diagram of a system 200 for controlling dynamic equalization of audio data, in accordance with an exemplary embodiment of the present disclosure. System 200 can be implemented in hardware or a suitable combination of hardware and software.

System 200 includes automatic gain control core 202 and automatic gain control multiplier 204, which are configured to receive an audio signal input and to generate a normalized audio signal output. The normalized audio signal output of AGC multiplier 204 can also be provided to crossover 102 or other suitable systems or components.

Filter 206 can be a band pass filter having a frequency range of 40 to 80 Hz or other suitable filters. The output from filter 206 is processed by RMS processor 208 to generate a signal that represents the RMS value of the output of filter 206. Derivative processor 210 receives the band pass RMS value and generates an output that represents the rate of change of the band pass RMS value. Downward expander 212 is used to prevent dynamic equalization of the associated frequency band when there is no associated transient occurring in the frequency band.

Filter 214 can be a band pass filter having a frequency range of 500 to 4000 Hz or other suitable filters. The output from filter 214 is processed by RMS processor 216 to generate a signal that represents the RMS value of the output of filter 214. Derivative processor 218 receives the band pass RMS value and generates an output that represents the rate of change of the band pass RMS value. Downward expander 220 is used to prevent dynamic equalization of the associated frequency band when there is no associated transient occurring in the frequency band.

Filter 222 can be a high pass filter having a frequency range of 4000 Hz and above or other suitable filters. The output from filter 222 is processed by RMS processor 224 to generate a signal that represents the RMS value of the output of filter 222. Derivative processor 226 receives the band pass RMS value and generates an output that represents the rate of change of the band pass RMS value. Downward expander 228 is used to prevent dynamic equalization of the associated frequency band when there is no associated transient occurring in the frequency band.

In operation, system 200 generates control inputs for a dynamic equalizer, by detecting transients in frequency bands associated with the dynamic equalization. System 200 thus helps to improve power consumption for an audio data processor, and also helps to improve the perceptual audio quality.

Figure 3:
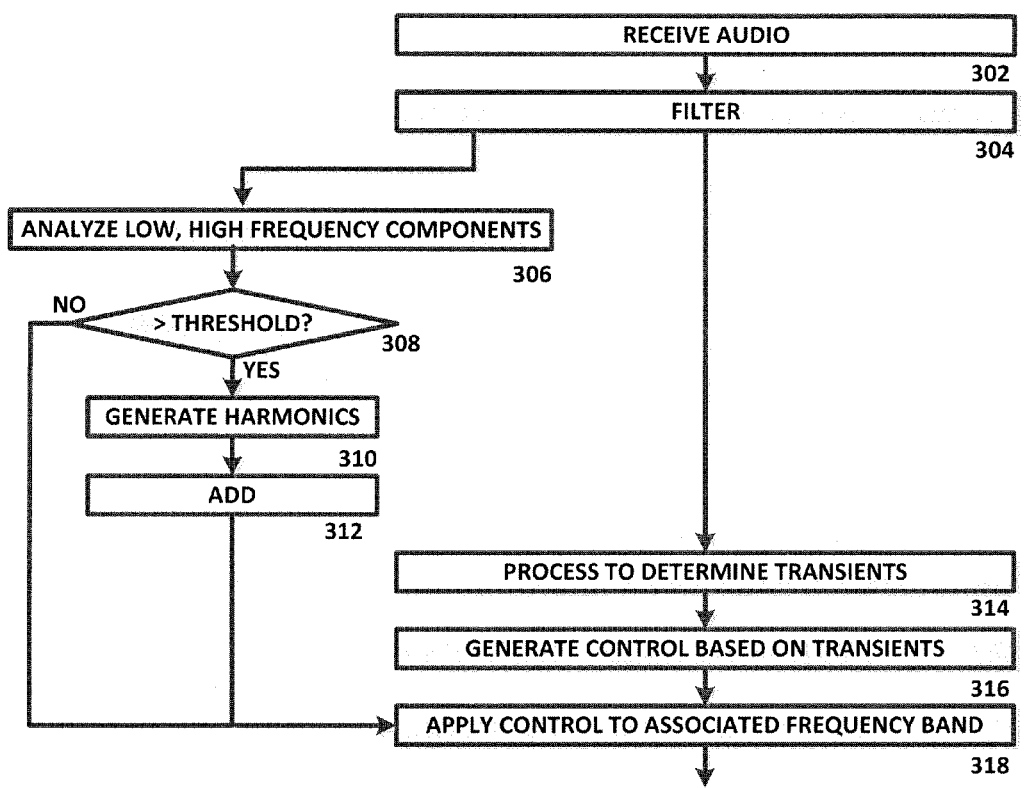
FIG. 3 is a diagram of an algorithm for dynamic equalization of audio data, in accordance with an exemplary embodiment of the present disclosure.

FIG. 3 is a diagram of an algorithm 300 for dynamic equalization of audio data, in accordance with an exemplary embodiment of the present disclosure. Algorithm 300 can be implemented in hardware or a suitable combination of hardware and software. Although algorithm 300 is shown as a flow chart, other suitable programming paradigms such as state diagrams and object-oriented programming can also or alternatively be used.

Algorithm 300 begins at 302, where audio data is received and processed, such as to generate a normalized audio signal by using a first adaptive gain control processor that is used to remove a DC signal component and a second adaptive gain control processor that receives the output of the first adaptive gain control processor and the input audio, or in other suitable manners. The algorithm then proceeds to 304, where the audio data is filtered to generate different bands of audio data. The algorithm then proceeds in parallel to 306 and 314.

At 306, the high and low frequency components of one or more of the bands of audio data are analyzed, such as to determine whether there is a greater RMS value of one component compared to the other. The algorithm then proceeds to 308, where it is determined whether the difference is indicative of an audio signal that is sparse or that otherwise would benefit from additional harmonic content, such as by exceeding a predetermined level. If the difference does not exceed the level, the algorithm proceeds to 318 where the unprocessed signal is dynamically equalized, otherwise the algorithm proceeds to 310, where harmonic content is generated. In one exemplary embodiment, harmonic content can be generated by clipping the audio signal and then filtering the clipped signal to remove predetermined harmonic frequency components, or in other suitable manners. The algorithm then proceeds to 312, where the harmonic content is added to unprocessed audio signal and the combined signal is processed at 318.

At 314, the audio signals are processed to determine whether a transient has occurred, such as by generating a derivative of an RMS value of the frequency component or in other suitable manners. A downward expander or other suitable components or processes can be used to ensure that the control signal is only generated for significant transients that will cause an associated psychoacoustic masking of predetermined associated audio frequency components. The algorithm then proceeds to 316, where a control signal is generated based on the transient. The control signal is applied to the audio signal to perform dynamic equalization at 318, such as to reduce the gain of the audio signal frequency components when a masking transient occurs, to both reduce power consumption and listener fatigue, and to improve audio quality to the listener.

In operation, algorithm 300 allows audio data to be dynamically equalized, by detecting masking transients and by using such masking transients to generate dynamic equalization controls. By dynamically equalizing the audio data that would otherwise not be perceptible to the listener, the amount of energy required to process the audio data can be reduced, and the perceived quality of the audio data can be improved.

FIG. 4 is a diagram of a system 400 for parametric stereo processing, in accordance with an exemplary embodiment of the present disclosure. System 400 can be implemented in hardware or a suitable combination of hardware and software.

System 400 includes time to frequency conversion system 402, which converts frames of a time-varying audio signal into frames of frequency components, such as by performing a fast-Fourier transform or in other suitable manners.

Bin comparison system 404 receives the frames of frequency domain data and compares the magnitude of the left channel audio data with the magnitude of the right channel audio data for each frequency bin.

Phase adjustment system 406 receives the comparison data for each bin of frequency data from bin comparison system 404 and sets the phase of the right channel frequency bin component equal to the phase of the left channel frequency bin component if the magnitude of the left channel frequency bin component is greater than the magnitude of the right channel frequency bin component. The output of phase adjustment system 406 is parametric audio data.

Surround processing system 408 receives the parametric audio data and generates surround audio data. In one exemplary embodiment, surround processing system 408 can receive speaker location data and can calculate a phase angle difference for the input audio data that corresponds to the location of the speaker. In this exemplary embodiment, surround processing system 408 can generate audio data for any suitable number of speakers in any suitable locations, by adjusting the phase angle of the parametric audio data to reflect the speaker location relative to other speakers.

In operation, system 400 allows audio data to be processed to generate parametric audio data, which can then be processed based on predetermined speaker locations to generate N-dimensional audio data. System 400 eliminates the phase data of the input audio data, which is not needed when the input audio data is processed to be output from speakers in non-stereophonic speaker locations.

FIG. 5 is a diagram of an algorithm 500 for parametric stereo processing, in accordance with an exemplary embodiment of the present disclosure. Algorithm 500 can be implemented in hardware or a suitable combination of hardware and software. Although algorithm 500 is shown as a flow chart, other suitable programming paradigms such as state diagrams and object-oriented programming can also or alternatively be used.

Algorithm 500 begins at 502 where audio data is received, such as analog or digital audio data in the time domain. The algorithm then proceeds to 504.

At 504, the audio data is converted from the time domain to the frequency domain, such as by performing a fast Fourier transform on the audio data or in other suitable manners. The algorithm then proceeds to 506.

At 506, it is determined whether the magnitude of a left channel frequency component of the frequency domain audio data is greater than the magnitude of the associated right channel frequency component. In one exemplary embodiment, 506 can be performed on a frequency component basis for each of the frequency components of the audio data, or in other suitable manners. If it is determined that the magnitude of a left channel frequency component of the frequency domain audio data is not greater than the magnitude of the associated right channel frequency component, the algorithm proceeds to 510, otherwise the algorithm proceeds to 508, where the phase of the right channel frequency component is replaced with the phase of the left channel frequency component. The algorithm then proceeds to 510.

At 510, the audio data is processed for an N-channel surround playback environment. In one exemplary embodiment, the locations of each of a plurality of speakers can be input into a system which can then determine a preferred phase relationship of the left and right channel audio data for that speaker. The phase and magnitude of the audio data can then be generated as a function of the speaker location, or other suitable processes can also or alternatively be used.

It should be emphasized that the above-described embodiments are merely examples of possible implementations. Many variations and modifications may be made to the above-described embodiments without departing from the principles of the present disclosure. All such modifications and variations are intended to be included herein within the scope of this disclosure and protected by the following claims.

What is claimed is:

1. A system for processing audio data comprising:
a plurality of gain adjustment devices, each gain adjustment device having an associated audio input frequency band;
a plurality of control signal processing systems, each control signal processing system configured to receive audio input data for one of the associated audio input frequency bands and to generate a gain adjustment device control signal;
a clipping system configured to receive the audio input data and to generate a clipped audio input signal;
a high pass filter coupled to the clipping system and configured to receive the clipped audio input signal and to generate high-pass filtered clipped audio data;
a scaler multiplier coupled to the high pass filter and configured to multiply the high-pass filtered clipped audio data by a predetermined value; and
a table coupled to the scaler multiplier and configured to receive a difference signal and to select the predetermined value as a function of the difference signal, wherein the gain adjustment device control signal is configured to decrease a gain setting of an associated gain adjustment device for a predetermined period of time as a function of a transient in the associated audio input frequency band.

2. The system of claim 1 further comprising a crossover filter coupled to a subtractor, the crossover filter configured to generate a low frequency output and a high frequency output and the subtractor configured to receive the low frequency output and the high frequency output and to generate the difference signal.

3. The system of claim 2 further comprising an RMS converter coupled between the crossover filter and the subtractor.

4. The system of claim 2 further comprising a linear to log converter coupled between the crossover filter and the subtractor.

5. The system of claim 1 further comprising an adder coupled to the table and one of the gain adjustment devices.

6. The system of claim 1 further comprising a crossover filter coupled to a subtractor, the crossover filter configured to generate a low frequency output and a high frequency output.

7. The system of claim 6 further comprising an RMS converter coupled between the crossover filter and a subtractor.

8. The system of claim 7 further comprising a linear to log converter coupled between the crossover filter and the subtractor.

9. A method for processing audio data comprising:
receiving audio input data for an associated audio input frequency band at a control signal processing system;
generating a gain adjustment device control for a gain adjustment device;
adjusting the gain adjustment device using the gain adjustment device control;
decreasing a gain setting of the gain adjustment device for a predetermined period of time as a function of a transient in the associated audio input frequency band;
generating a clipped audio input signal from the audio input data with a clipping system;
generating high-pass filtered clipped audio data from the clipped audio input signal using a high pass filter coupled to the clipping system;
multiplying the high-pass filtered clipped audio data by a predetermined value using a scaler multiplier coupled to the high pass filter; and
receiving a difference signal at a table coupled to the scaler multiplier and selecting the predetermined value as a function of the difference signal.

10. The method of claim 9 further comprising:
generating a low frequency output and a high frequency output with a crossover filter coupled to the subtractor; and
receiving the low frequency output and the high frequency output at the subtractor and generating the difference signal.

11. The method of claim 10 further comprising coupling an RMS converter between the crossover filter and the subtractor.

12. The method of claim 10 further comprising coupling a linear to log converter between the crossover filter and the subtractor.

13. The method of claim 9 further comprising coupling an adder to the table and one of the gain adjustment devices.

14. A system for processing audio data comprising:
a plurality of gain adjustment devices, each gain adjustment device having an associated audio input frequency band;
a plurality of control signal processing systems, each control signal processing system configured to receive audio input data for one of the associated audio input frequency bands and to generate a gain adjustment device control signal;
wherein the gain adjustment device control signal is configured to decrease a gain setting of an associated gain adjustment device for a predetermined period of time as a function of a transient in the associated audio input frequency band;
a clipping system configured to receive the audio input data and to generate a clipped audio input signal;

a high pass filter coupled to the clipping system and configured to receive the clipped audio input signal and to generate high-pass filtered clipped audio data;

a scaler multiplier coupled to the high pass filter and configured to multiply the high-pass filtered clipped audio data by a predetermined value;

wherein a table is coupled to the scaler multiplier and is configured to receive a difference signal and to select the predetermined value as a function of the difference signal.

15. The system of claim 14 further comprising a crossover filter coupled to the subtractor, the crossover filter configured to generate a low frequency output and a high frequency output and the subtractor configured to receive the low frequency output and the high frequency output and to generate the difference signal.

16. The system of claim 15 further comprising an RMS converter coupled between the crossover filter and the subtractor.

17. The system of claim 16 further comprising a linear to log converter coupled between the crossover filter and the subtractor.

* * * * *